United States Patent
Baum

(10) Patent No.: US 6,396,000 B1
(45) Date of Patent: May 28, 2002

(54) PRINTED CIRCUIT BOARD AND METHOD FOR REDUCING RADIO FREQUENCY INTERFERENCE EMISSIONS FROM CONDUCTIVE TRACES ON A PRINTED CIRCUIT BOARD

(75) Inventor: Aaron M. Baum, Meridian, ID (US)

(73) Assignee: Hewlett-Packard Co., Palo Alto, CA (US)

(*) Notice: Subject to any disclaimer, the term of this patent is extended or adjusted under 35 U.S.C. 154(b) by 0 days.

(21) Appl. No.: 09/659,114

(22) Filed: Sep. 11, 2000

(51) Int. Cl.[7] .......................... H01R 12/04; H05K 1/11
(52) U.S. Cl. .................. 174/261; 174/262; 174/33; 174/36; 361/777
(58) Field of Search ................. 174/261, 262, 174/264, 265, 36, 250, 254, 255, 33; 361/777, 778, 779

(56) References Cited

U.S. PATENT DOCUMENTS

| | | | | |
|---|---|---|---|---|
| 3,761,842 A | * | 9/1973 | Gandrud | 333/1 |
| 3,764,727 A | * | 10/1973 | Balde | 174/34 |
| 5,039,824 A | * | 8/1991 | Takashima et al. | 174/33 |
| 5,357,050 A | | 10/1994 | Baran et al. | 174/33 |
| 5,430,247 A | * | 7/1995 | Bockelman | 174/33 |
| 5,459,284 A | * | 10/1995 | Bockelman et al. | 174/34 |
| 5,646,368 A | * | 7/1997 | Muyshondt et al. | 174/33 |
| 6,057,512 A | * | 5/2000 | Noda et al. | 174/250 |

* cited by examiner

Primary Examiner—Kamand Cuneo
Assistant Examiner—Jose' H. Alcalá

(57) ABSTRACT

A printed circuit board includes a first helical conductive trace and a second helical conductive trace. The first helical conductive trace extends generally along a longitudinal axis of a layer of the printed circuit board. The first helical conductive trace is provided successively: along a first surface, from the first surface through the layer to a second surface, along the second surface, and from the second surface through the layer to the first surface. The second helical conductive trace extends generally along the longitudinal axis of the layer of the printed circuit board. The second helical conductive trace is provided successively: along the second surface, from the second surface through the layer to the first surface, along the first surface, and from the first surface through the layer to the second surface. A method is also provided.

11 Claims, 2 Drawing Sheets

PRINTED CIRCUIT BOARD AND METHOD FOR REDUCING RADIO FREQUENCY INTERFERENCE EMISSIONS FROM CONDUCTIVE TRACES ON A PRINTED CIRCUIT BOARD

FIELD OF THE INVENTION

This invention pertains to emissions reduction from signals along communications lines. More particularly, this invention relates to the routing of traces on a printed circuit (PC) board to decrease emissions that are radiated from high speed differential signals on the PC board.

BACKGROUND OF THE INVENTION

Differential twisted pair cabling has previously been implemented to help reduce radio frequency interference (RFI) emissions, or more broadly, electromagnetic field emissions resulting from transmission of signals on signal cables. In order to reduce RFI, a cancelling effect is generated by twisting together a pair of wires. Such result is relatively easy to achieve with a pair of cables. However, successful implementation of signal paths on a printed circuit (PC) board in a manner that reduces RFI using conductive traces is more difficult to realize. Accordingly, further improvements are needed in order to maximize electromagnetic field and RFI emissions cancellation.

One PC board implementation for routing differential signals on a printed circuit (PC) board consists of routing a pair of conductive traces close together and in parallel at a minimum possible adjacent spacing. Additionally, the differential pair of conductive traces are sometimes ground guarded using conductive ground traces on both of the pair of conductive traces. However, an undesirable current loop results from separation of the two conductive traces.

More particularly, such a parallel pair of conductive traces will emit RFI emissions, and more broadly, electromagnetic field emissions. Such electromagnetic (E) field emissions are generated from the differential loop, and are proportional to:

$$E \propto f^2 * A * I$$

where f is the frequency of the signal, A is the area of the loop that is created by the separation of the two conductive traces, and I is the current within the two conductive traces.

As an example, the effective radiating area of one exemplary differential loop, created by a 6-inch differential conductive trace run that is separated by 0.006 inches, is 0.036 inches-2. For cases of relatively high frequency signal transmission and/or high current levels, such a relatively small area can create significant levels of radiation.

Accordingly, improvements are needed to more effectively reduce RFI emissions, as well as electromagnetic field (E-field) emissions, on conductive traces of printed circuit (PC) boards.

SUMMARY OF THE INVENTION

A differential twisted-pair cabling implementation on a printed circuit (PC) board maximizes RFI and E-field emissions cancellation. Additionally, trace impedance is also adjustable to facilitate matching with an associated cable impedance by providing for a geometry that enables adjustment of conductive trace width on the PC board.

According to one aspect, a printed circuit board includes a first helical conductive trace and a second helical conductive trace. The first helical conductive trace extends generally along a longitudinal axis of a layer of the printed circuit board. The first helical conductive trace is provided successively: along a first surface, from the first surface through the layer to a second surface, along the second surface, and from the second surface through the layer to the first surface. The second helical conductive trace extends generally along the longitudinal axis of the layer of the printed circuit board. The second helical conductive trace is provided successively: along the second surface, from the second surface through the layer to the first surface, along the first surface, and from the first surface through the layer to the second surface.

According to another aspect, a printed circuit board includes a first conductive trace and a second conductive trace. The first conductive trace extends along a longitudinal axis of a layer of the printed circuit board provided in series along a first surface, from the first surface through the layer to a second surface, along the second surface, and from the second surface through the layer to the first surface. The second conductive trace extends along the longitudinal axis of the layer of the printed circuit board provided in series along the second surface, from the second surface through the layer to the first surface, along the first surface, and from the first surface through the layer to the second surface. The first conductive trace and the second conductive trace are inter-nested and both extend in one of a clockwise and a counter-clockwise helical pattern about a substantially common longitudinal axis of the printed circuit board.

According to yet another aspect, a method is provided for reducing radio frequency interference emissions from conductive traces on a printed circuit (PC) board. The method includes: providing a printed circuit board; forming a first conductive trace for carrying a signal generally along a longitudinal axis of a layer of the printed circuit board provided in series along a first surface, from the first surface through the layer to a second surface, along the second surface, and from the second surface through the layer to the first surface; and forming a second conductive trace for carrying a return signal generally along the longitudinal axis of the layer of the printed circuit board provided in series along the second surface, from the second surface through the layer to the first surface, along the first surface, and from the first surface through the layer to the second surface.

Other advantages of the invention will become apparent to those of ordinary skill in the art upon review of the following detailed description, claims, and drawings.

DESCRIPTION OF THE DRAWINGS

Preferred embodiments of the invention are described below with reference to the following accompanying drawings depicting examples embodying the best mode for practicing the invention.

DETAILED DESCRIPTION OF THE INVENTION

This disclosure of the invention is submitted in furtherance of the constitutional purposes of the U.S. Patent Laws "to promote the progress of science and useful arts". U.S. Constitution, Article 1, Section 8.

Reference will now be made to a preferred embodiment of Applicant's invention. An exemplary implementation is described below and depicted with reference to the drawings comprising a differential twisted-pair cabling of conductive traces on a printed circuit (PC) board. While the invention is described by way of a preferred embodiment, it is understood that the description is not intended to limit the invention to this embodiment, but is intended to cover even broader alternatives, equivalents, and modifications such as are included within the scope of the appended claims.

In an effort to prevent obscuring the invention at hand, only details germane to implementing the invention will be described in great detail, with presently understood peripheral details being incorporated by reference, as needed, as being presently understood in the art.

Figure 1:
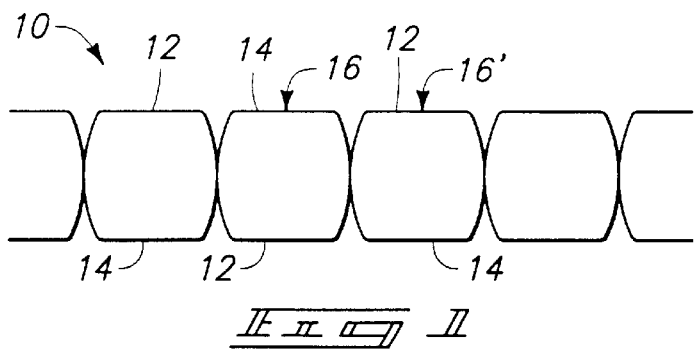
FIG. 1 is a simplified schematic view of a twisted pair cable routing construction.

FIG. 1 illustrates a twisted-pair cable routing construction for a pair of twisted cables. Such a set 10 of differential twisted-pair cables have previously been used to help reduce radio frequency interference (RFI) emissions, such as high frequency electromagnetic waves, from signals that are delivered on cables, wherein one cable is a signal cable and the other cable is a return signal cable.

Figure 2:
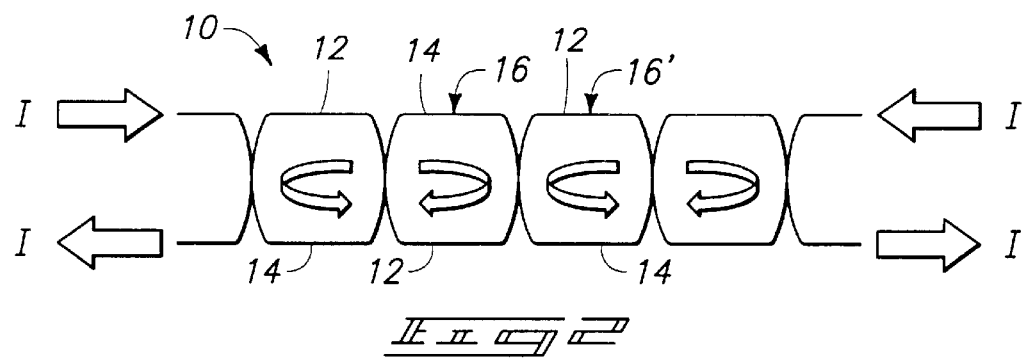
FIG. 2 is a simplified schematic view of the cable routing construction of, FIG. 1 illustrating current flow directions that cancel radio frequency interference emissions and electromagnetic field emissions for adjacent loops.

For purposes of understanding twisted-pair cabling concepts, the principles of such concepts are discussed in simplified form with reference to a twisted pair cabling as shown in FIGS. 1 and 2. The more difficult task of implementing such concept effectively on conductive traces of a printed circuit board is illustrated in greater detail with reference to FIGS. 3–5. Accordingly, radio frequency interference (RFI) and electromagnetic field emissions that are radiated from high speed differential signals on conductive traces of a printed circuit (PC) board are significantly decreased to an acceptable level.

As shown in FIG. 1, a conductive cable routing technique is implemented on a pair of conductive cables, or wires, 12 and 14. Such routing technique is also desirable for use with conductive traces on a PC board, and is implemented using Applicant's techniques illustrated below with reference to FIGS. 3–5.

In the twisted pair cabling construction of FIG. 1, cables 12 and 14 are twisted together into relatively small loops 16 of wire. Taking into account the direction of current flow, any loop 16 and the neighboring, adjacent loop 16' will have current flows extending in opposite directions, as shown below with reference to FIG. 2. However, this exact construction is not reproducible on a printed circuit (PC) board.

FIG. 2 is a simplified schematic view of the cable routing construction of FIG. 1 illustrating current flow directions that cancel electromagnetic fields for adjacent loops 16 and 16'. Such cancellation also cancels associated radio frequency interference (RFI) emissions. Because current flows in opposite directions in adjacent loops 16 and 16', a cancellation occurs in the electromagnetic (E) fields generated by adjacent loops 16 and 16'. In a sense, adjacent loop areas emit RFI in opposite directions which imparts a significant cancellation of such RFI emissions.

Typically, cables 12 and 14 each comprise a copper wire that is coated with an outer insulating layer such as a plastic coating. In this manner, cables 12 and 14 are insulated from one another such as where they are twisted together at the cross-over points of each loop 16. However, there is no apparently easy way to realize coincident placement of cables 12 and 14 at the cross-over points, which would cancel out electromagnetic field effects thereabout. In essence, printed circuit (PC) board conductive trace routing techniques present problems that prohibit realization of the twisted-pair cabling construction of FIGS. 1 and 2.

Figure 3:
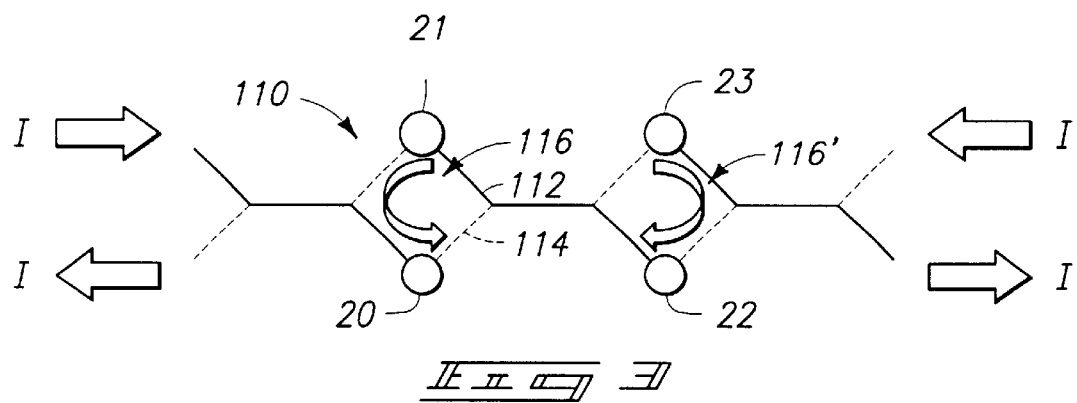
FIG. 3 is a simplified schematic plan view of a conductive trace layout for a differential twisted-pair cabling on a printed circuit (PC) board according to one construction.
Figure 4:
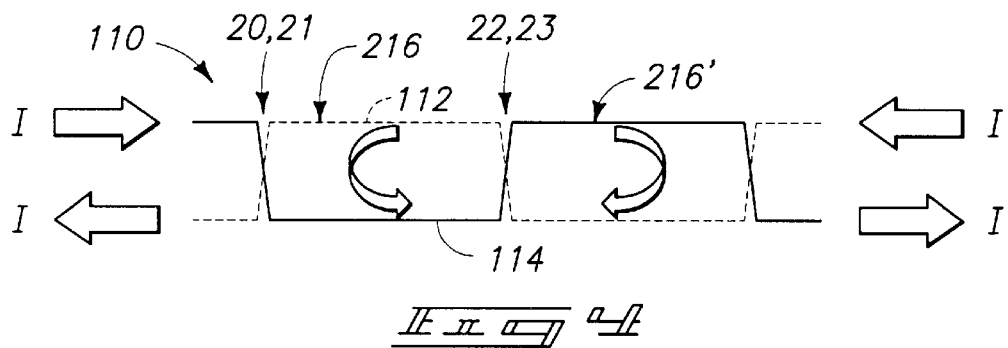
FIG. 4 is a simplified schematic side view of the conductive trace layout of FIG. 3.
Figure 5:
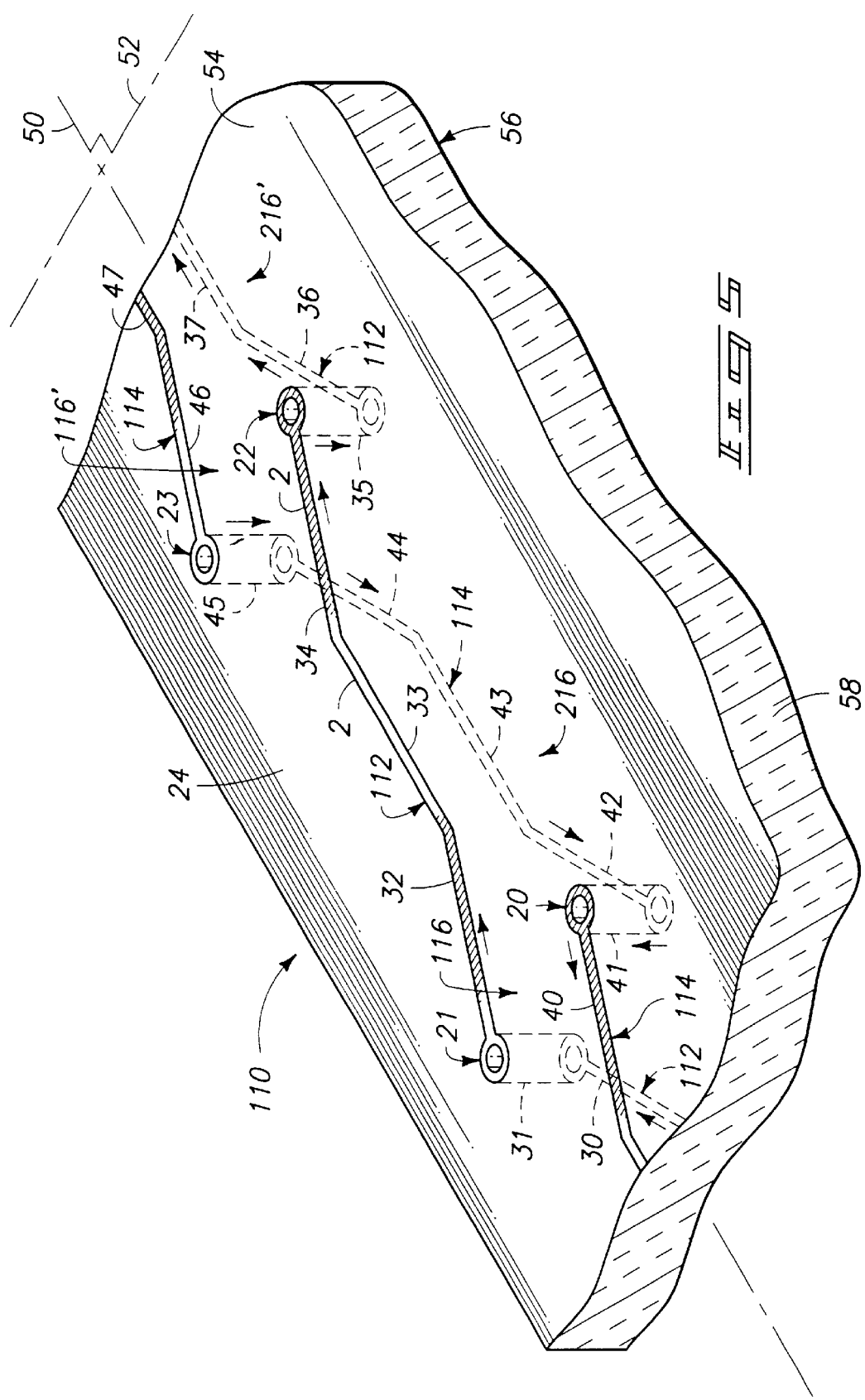
FIG. 5 is a partial breakaway perspective view of the conductive trace layout of FIGS. 3 and 4.

Applicant's construction of FIGS. 3–5 addresses such problem, enabling realization of such features while minimizing electromagnetic field emissions such as RFI emissions.

Accordingly, it is desirable to implement, as best as possible, the above features of twisted-pair cable routing on conductive traces of a printed circuit (PC) board. Applicant's technique provides an improved routing of differential pairs of conductive traces on alternating adjacent layers of a PC board which substantially achieves the desired canceling effects of RFI and electromagnetic emissions.

As shown and described below generally with reference to FIGS. 3–5, adjacent loop areas on a PC board are almost exactly matched in an effort to more completely cancel generated electromagnetic fields (or E-fields). For purposes of this discussion, loops 116 and 116' do not actually form loops in a three-dimensional sense. However, in plan view (FIG. 3) and side view (FIG. 4), loops 116, 116' and 216, 216' form the two-dimensional projected appearance of loops. Instead, conductive traces 112 and 114 are provided on PC board 24 (of FIG. 5) in a helical arrangement wherein associated portions of traces 112 and 114 are parallel and in close proximity to one another, with current flowing in opposite directions so as to substantially cancel out electromagnetic field effects therebetween.

Accordingly loops 116 and 116' of FIGS. 3–5 are really three dimensional segments of a helix, unlike the loops of FIGS. 1 and 2. Such helical configuration is necessitated by the layout difficulties present by placing conductive traces onto PC board 24. Accordingly, sections of loops 116 and 116' are laid out so as to maximize cancellation of electromagnetic field and RFI emissions from adjacent loops 116 and 116'.

As shown in FIG. 3, a plan view of one exemplary conductive trace layout is illustrated. More particularly, in plan view a pair of adjacent current flow loop areas 116 and 116' is shown. A series of such adjacent current flow loop areas 116 and 116', each having opposite current flow direction, is formed between conductive traces 112 and 114 along PC board 24 (of FIG. 5). It is understood that loops 116 and 116' are not actually complete loops. However, in plan view (and in side view shown in FIG. 4 with loops 216 and 216') such loops 116 and 116' are projected in two dimensions to appear as loops.

The general helical nature of conductive traces 112 and 114 provides adjacent conductive portions and loops that are configured for substantially opposed and parallel current flow, and that provide adjacent current flow loop areas which impart highly effective cancellation of RFI and electromagnetic field emissions from conductive traces 112 and 114.

Current flow loops 116 and 116' are equivalent in loop area. However, current flow occurs in opposite directions which causes electromagnetic field cancellation therebetween. In other words, a signal is carried in a first direction and a return signal is carried in an opposite direction, but in a twisted-pair configuration such that adjacent current flow loops containing current flow in opposite directions, as viewed in a projected, two-dimensional plane.

As shown in FIG. 4, in plan view a pair of adjacent current flow loops 216 and 216' are shown. Such loops are not complete, closed loops, except they appear that way when observed in a two-dimensional side view. However, adjacent conductive portions and loops (in side view) are configured for substantially opposed and parallel current flow in adjacent current flow loops, which imparts highly effective cancellation of RFI and electromagnetic field emissions from conductive traces 112 and 114.

Current flow loops 216 and 216' are equivalent in loop area. However, current flow occurs in opposite directions which causes RFI and electromagnetic field cancellation therebetween.

FIG. 5 illustrates placement of conductive traces 112 and 114 on PC board 24 so as to minimize emissions from differential signal pairs on traces 112 and 114, in a manner that requires little or no additional cost when preparing PC board 24. PC board 24 illustrates a cable set 110 comprising a first, clockwise helical conductive trace 112 and a second, clockwise helical conductive trace 114 out of phase by 180° with trace 112. Optionally, traces 112 and 114 can both be counter-clockwise helical traces which are out of phase by 180°. Further optionally, trace 112 can be clockwise and trace 114 can be counter-clockwise as long as electrical isolation is provided therebetween. Furthermore, the phase shift can deviate as long as electrical isolation is provided therebetween. Helical conductive trace 112 and helical conductive trace 114 are inter-nested about a common longitudinal axis 50 of PC board 24.

More particularly, trace 112 extends generally along a longitudinal axis of a layer 58 of PC board 24. Similarly, trace 114 extends generally along longitudinal axis 50 of the layered PC board 24. Trace 112 extends successively along a first, or top, surface 54, from first surface 54 through layer 58 to a second surface 56, along the second surface 56, and from the second surface 56 through layer 58 to first surface 54.

Similarly, along the same section of layer 58, trace 114 extends successively along second surface 56, from second surface 56 through layer 58 to first surface 54, along first surface 54, and from first surface 54 through layer 58 to second surface 56.

As shown in FIG. 5, trace 112 comprises a plurality of discrete conductive segments 30–37 joined end-for-end to form a shape approximating a cylindrical helix. Segments 31 and 35 each comprise an electrically conductive via 21 and 22, respectively, extending through layer 58. Similarly, trace 114 comprises a plurality of discrete conductive segments 40–47 joined end-for-end to form a shape approximating a cylindrical helix. Segments 41 and 45 of trace 114 each comprises an electrically conductive via extending through layer 58. Vias 21, 20 and 22, 23, respectively, are provided in laterally spaced-apart relation in pairs spaced apart along lateral axis 52.

According to FIG. 5, segments 33, 37 and 43, 47 of traces 112 and 114, respectively, each comprise a longitudinally extending surface trace extending along surfaces 54, 56 and 56, 54, respectively. As shown in FIG. 5, longitudinally extending surface traces 33, 43 and traces 37, 47 lie substantially atop one another on opposed surfaces, being spaced apart by the thickness of layer 58.

Accordingly, longitudinally extending surface traces 33 and 37 of helical conductive trace 112 are parallel and coincident across layer 58 with corresponding longitudinally extending surface traces 43 and 47 of helical conductive trace 114.

Additionally, segments 30, 32, 34, 36 and segments 40, 42, 44, 46 of helical conductive trace 112 and helical conductive trace 114, respectively, each comprise a laterally extending conductive surface trace segment extending from each end of a respective longitudinally extending surface trace segment.

It is understood that the inter-nesting of the clockwise helixes formed by traces 112 and 114 do not present perfect loops, as are generated in FIGS. 1 and 2. However, when viewed in a plane extending parallel to axis 50, the visualization of loops is projected in two dimensions. For example, in plan view corresponding loops 116 and 116' are evident next to one another. Similarly, in side view loops 216 and 216' are seen in adjacent relationship. RFI emissions and electromagnetic field emissions are cancelled because current flow occurs in directions that are opposite in adjacent loops, when viewed in plan view as well as side view (or any other view parallel to axis 50). Accordingly, a significant amount of cancellation is imparted between RFI and electromagnetic field emissions therebetween.

Such a routing technique allows for decreased emissions from differential signal pairs while adding little or no additional printed circuit board cost of layout and construction. Such routing can be easily controlled to allow for a maximum amount of electromagnetic field cancellation. Furthermore, because such routing is implemented using conductive traces on a printed circuit board, trace impedance can be adjusted to match cable impedance for associated cables by simply adjusting the trace widths.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A printed circuit board, comprising:
  a first helical conductive trace extending generally along a longitudinal axis of a layer of the printed circuit board provided successively:
    along a first surface, as a longitudinally extending surface trace and a laterally extending surface trace provided at each end of the longitudinally extending surface trace,
    from the first surface through the layer to a second surface,
    along the second surface, and
    from the second surface through the layer to the first surface; and
  a second helical conductive trace extending generally along the longitudinal axis of the layer of the printed circuit board provided successively:
    along the second surface as a longitudinally extending surface trace and a laterally extending surface trace provided at each end of the longitudinally extending surface trace,
    from the second surface through the layer to the first surface,
    along the first surface, and
    from the first surface through the layer to the second surface,
  wherein the longitudinally extending surface trace of the first helical conductive trace and the second helical trace lie substantially parallel and a long one another, on one of the first surface and the second surface, respectively.

2. The printed circuit board of claim 1 wherein the first helical conductive trace and the second helical conductive trace each comprise an electrically conductive via extending through the layer of the printed circuit board, wherein the respective conductive trace extends between the first surface and the second surface along the via.

3. The printed circuit board of claim 1 wherein the first helical conductive trace and the second helical conductive trace each comprise a plurality of discrete conductive segments joined end-for-end to form a shape approximating a cylindrical helix, wherein the first helical conductive trace and the second helical conductive trace are electrically isolated, both extend in a clockwise or a counter-clockwise direction, and are in axial mirror image with one another.

4. The printed circuit board of claim 3 wherein one of the segments for each trace comprises an electrically conductive via extending through the layer, wherein one via from the first helical conductive trace is provided laterally spaced apart relative to the longitudinal axis with a corresponding another via from the second helical conductive trace.

5. The printed circuit board of claim 1 wherein the first helical conductive trace and the second helical conductive trace both extend in a clockwise or a counter-clockwise helical shape and are inter-nested about a common longitudinal axis of the printed circuit board out of phase with one another.

6. A printed circuit board, comprising:
a first conductive trace along a longitudinal axis of a layer of the printed circuit board comprising a longitudinally extending surface trace provided along a first surface and having a laterally extending surface trace provided at each end of the longitudinally extending surface trace, from the first surface through the layer to a second surface, along the second surface as a longitudinally extending surface trace and a laterally extending surface trace provided at each end of the longitudinally extending surface trace, and from the second surface through the layer to the first surface; and
a second conductive trace along the longitudinal axis of the layer of the printed circuit board comprising a longitudinally extending surface trace provided along the second surface and having a laterally extending surface trace provided at each end of the longitudinally extending surface trace, from the second surface through the layer to the first surface, along the first surface as a longitudinally extending surface trace and a laterally extending surface trace provided at each end of the longitudinally extending surface trace, and from the first surface through the layer to the second surface;

wherein the first conductive trace and the second conductive trace are inter-nested in axial mirror image relation and both extend in one of a clockwise and a counter-clockwise helical pattern about a substantially common longitudinal axis of the printed circuit board.

7. The printed circuit board of claim 6 wherein the first conductive trace and the second conductive trace are out of phase with one another and each comprises a discretized helical pattern of conductive trace segments provided on the printed circuit board.

8. The printed circuit board of claim 6 wherein, in plan view of the printed circuit board, the first conductive trace and the second conductive trace cooperate to generate a plurality of side-by-side conductive trace loops, with adjacent conductive trace loops having current flow in opposite clockwise and counterclockwise directions such that radio frequency interference emissions are substantially cancelled therebetween.

9. The printed circuit board of claim 6 wherein the first conductive trace, extending from the first surface through the layer to the second surface, comprises a first electrically conductive via disposed laterally of the longitudinal axis, and wherein the second conductive trace, extending from the second surface through the layer to the first surface, comprises a second electrically conductive via disposed laterally of the longitudinal axis in mirror image across the longitudinal axis from the first electrically conductive via.

10. The printed circuit board of claim 6 wherein the first conductive trace and the second conductive trace each comprise a plurality of discrete conductive segments joined end-for-end to form a shape approximating a first cylindrical helix and a second cylindrical helix.

11. The printed circuit board of claim 10 wherein the first cylindrical helix and the second cylindrical helix each extend in one of a common clockwise or counter-clockwise direction about a common, longitudinal axis in a repeating pattern, and in axial mirror image with one another.

* * * * *

UNITED STATES PATENT AND TRADEMARK OFFICE
CERTIFICATE OF CORRECTION

PATENT NO. : 6,396,000 B1
DATED : May 28, 2002
INVENTOR(S) : Aaron M. Baum

It is certified that error appears in the above-identified patent and that said Letters Patent is hereby corrected as shown below:

<u>Column 7,</u>
Line 23, "board" should read -- board. --, "out of phase with one another." should be deleted.

Signed and Sealed this

Twenty-fifth Day of March, 2003

JAMES E. ROGAN
*Director of the United States Patent and Trademark Office*